(12) United States Patent
Hosoba et al.

(10) Patent No.: US 6,465,812 B1
(45) Date of Patent: Oct. 15, 2002

(54) SEMICONDUCTOR LIGHT EMITTING DEVICE

(75) Inventors: Hiroyuki Hosoba, Kyoto; Hiroshi Nakatsu, Nara; Takahisa Kurahashi, Nara; Tetsuroh Murakami, Nara; Kazuaki Sasaki, Osaka; Junichi Nakamura, Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/671,777

(22) Filed: Sep. 27, 2000

(30) Foreign Application Priority Data

Sep. 27, 1999 (JP) .............................. 11-273452
Jul. 19, 2000 (JP) ........................... 2000-219898

(51) Int. Cl.[7] ...................... H01L 33/00; H01L 31/0304
(52) U.S. Cl. .......................... 257/103; 257/98; 257/97; 257/190; 372/45
(58) Field of Search .................... 257/190, 97, 98, 257/103; 372/45

(56) References Cited

U.S. PATENT DOCUMENTS 5,194,400 A * 3/1993 Takamori et al. .... 148/DIG. 95
5,317,167 A * 5/1994 Izumiya et al. ................ 257/13
6,063,643 A * 5/2000 Dutta .......................... 438/26
6,229,834 B1 * 5/2001 Nisitani et al. ............... 257/94

FOREIGN PATENT DOCUMENTS

JP 6-296062 A 10/1994
JP 8-203837 A 8/1996

* cited by examiner

Primary Examiner—Jerome Jackson
(74) Attorney, Agent, or Firm—Nixon & Vanderhye P.C.

(57) ABSTRACT

A semiconductor light emitting device of the present invention at least includes: a GaAs substrate whose principal plane is inclined from a (100) plane in a [011] orientation; a first buffer layer of $Al_xGa_{1-x}As$ ($0 \leq x \leq 1$) provided on the principal plane of the GaAs substrate; a second buffer layer of $Al_yGa_zIn_{1-y-z}P$ ($0 \leq y \leq 1$ and $0 \leq z \leq 1$) provided on the first buffer layer; a first cladding layer of $Al_aGa_tIn_{1-a-t}P$ ($0 \leq s \leq 1$ and $0 \leq t \leq 1$) provided on the second buffer layer; an active layer provided on the first cladding layer; and a second cladding layer provided on the active layer, wherein an Al content s of the first cladding layer is larger than an Al content y of the second buffer layer.

17 Claims, 7 Drawing Sheets

Plane inclined from (100) plane
toward [110] orientation

SEMICONDUCTOR LIGHT EMITTING DEVICE

BACKGROUND OF THE INVENTION

1. Field of the Invention

The present invention relates to a semiconductor light emitting device such as a light emitting diode, a semiconductor laser device, or the like. More particularly, the present invention relates to a semiconductor light emitting device in which a light emitting section made of an AlGaInP type semiconductor material is formed on a GaAs substrate.

2. Description of the Related Art

A semiconductor device using an AlGaInP type semiconductor material has been used as a visible range light emitting device for its advantages such as the capability of achieving the lattice match between a GaAs substrate and the AlGaInP type semiconductor material and that it has the greatest direct transition band gap among the group III–V compound semiconductor materials. Known semiconductor devices using such a material include light emitting diodes, semiconductor laser devices, and the like.

Where an AlGaInP type semiconductor layer is epitaxially grown on a GaAs substrate by using an MOCVD (metal-organic chemical vapor deposition) method, or an MBE (molecular beam epitaxial) method, it is necessary in order to achieve a desirable crystallinity that an impurity such as oxygen is not introduced and that a desirable two-dimensional growth is achieved.

Figure 9:
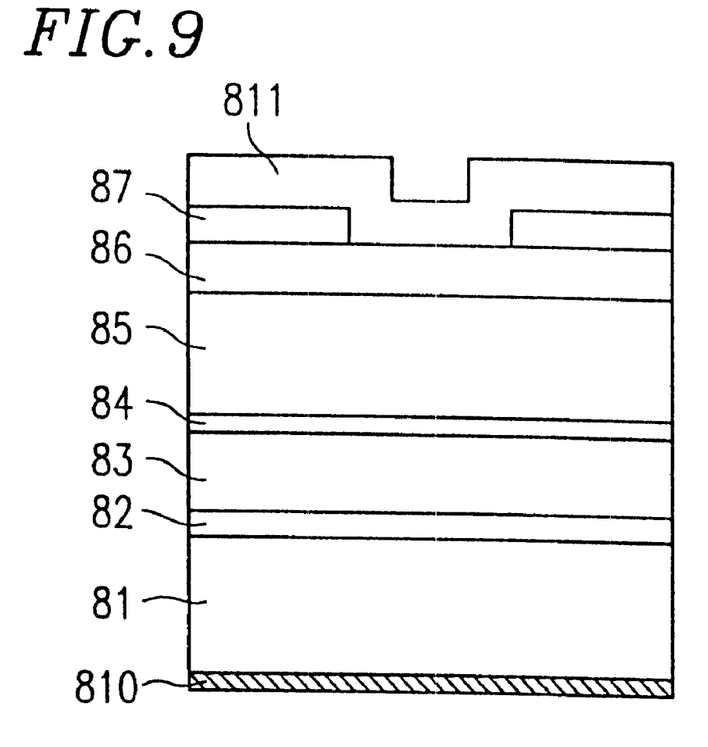
FIG. 9 is a schematic cross-sectional view illustrating a structure of a conventional semiconductor light emitting device.

In view of this, Japanese Laid-Open Publication No. 6-57149 discloses method for producing a conventional AlGaInP type semiconductor laser device as shown in FIG. 9 in which an AlGaInP layer is grown on a plane of an n-GaAS substrate 01 whose principal plane is inclined from the (100) plane toward the [011] orientation.

In this method, first, an n-GaInP or n-AlGaInP buffer layer 82, an n-AlGaInP cladding layer 83, a GaInP active layer 84, a p-AlGaInP cladding layer 85 and a p-GaAs cap layer 86 are grown by an MOCVD method in this order on the n-Gas substrate 81 whose principal plane is inclined from the (100) plane toward the [011] orientation. Then, an SiO$_2$ film 87 is formed on the p-GaAs cap layer 86, and the central portion of the SiO$_2$ film 87 is etched in a stripe pattern. An electrode 811 is formed over the SiO$_2$ film 87, and an electrode 810 is formed on the reverse side of the n-GaAs substrate 81.

In this conventional method for producing a semiconductor laser device, a GaInP or AlGaInP buffer layer is grown on the principal plane of a GaAs substrate which is inclined from the (100) plane toward the [011] orientation, and then an AlGaInP type light emitting section is grown by an MOCVD method.

In this method, however, the effects of inclining the principal plane of the GaAs substrate from the (100) plane toward the [011] orientation do not sufficiently manifest themselves for the following reasons. First, the GaInP or AlGaInP buffer layer is grown directly on the GaAs substrate. Second, a single composition is used for the buffer layer.

SUMMARY OF THE INVENTION

According to one aspect of this invention, there is provided a semiconductor light emitting device at least including: a GaAs substrate whose principal plane is inclined from a (100) plane in a [011] orientation; a first buffer layer of Al$_x$Ga$_{1-x}$As ($0 \leq x \leq 1$) provided on the principal plane of the GaAs substrate; a second buffer layer of Al$_y$Ga$_z$In$_{1-y-s}$P ($0 \leq y \leq 1$ and $0 \leq z \leq 1$) provided on the first buffer layer; a first cladding layer of Al$_s$Ga$_t$In$_{1-s-t}$P ($0 \leq s \leq 1$ and $0 \leq t \leq 1$) provided on the second buffer layer; an active layer provided on the first cladding layer: and a second cladding layer provided on the active layer, wherein an Al content a of the first cladding layer is larger than an Al content y of the second buffer layer.

In one embodiment of the invention, the principal plane of the Gays substrate is inclined from the (100) plane toward the [011] orientation by an angle equal to or greater than about 2°.

In one embodiment of the invention, the Al content y of the second buffer layer is equal to or greater than about 0.3 and less than or equal to about 0.8.

In one embodiment of the invention, a growth temperature for the second buffer layer is different from that for the first cladding layer.

In one embodiment of the invention, a growth temperature for the second buffer layer is equal to that for the first cladding layer.

In one embodiment of the invention, a growth temperature for the first buffer layer is equal to that for the second buffer layer.

In one embodiment of the invention, the second buffer layer is grown while changing a growth temperature therefor in a stepwise or continuous manner.

In one embodiment of the invention, the first cladding layer is grown while changing a growth temperature therefor in a stepwise or continuous manner.

In one embodiment of the invention, the semiconductor light emitting device further includes a current diffusing layer on the second cladding layer.

In one embodiment of the invention, the semiconductor light emitting device further includes a current blocking layer between the second cladding layer and the current diffusing layer.

In one embodiment of the invention, the current blocking layer is provided in a central portion of the semiconductor light emitting device.

In one embodiment of the invention, the current blocking layer is provided in a peripheral portion of the semiconductor light emitting device.

In one embodiment of the invention, the active layer is a quantum well active layer obtained by depositing a number of quantum well layers and a number of barrier layers in an alternating pattern.

In one embodiment of the invention, the semiconductor light emitting device further includes a is current blocking layer provided on the second cladding layer and a cap layer provided on the current blocking layer.

In one embodiment of the invention, the semiconductor light emitting device further includes a light reflecting layer provided closer to the GaAs substrate with respect to the first cladding layer.

According to another aspect of this invention, there is provided a method for producing a semiconductor light emitting device through a vapor phase deposition method on a principal plane of a GaAs substrate which is inclined from a (100) plane toward a [011] orientation, the method including the steps of: (a) growing a first buffer layer of Al$_x$Ga$_{1-x}$As ($0 \leq x \leq 1$) on the principal plane of the GaAs substrate; (b) growing a second buffer layer of Al$_y$Ga$_x$In$_{1-y-z}$P ($0 \leq y \leq 1$ and $0 \leq z \leq 1$) on the first buffer layer; and (c) sequentially growing a first cladding layer of Al$_z$Ga$_t$In$_{1-s-t}$P ($0 \leq s \leq 1$ and $0 \leq t \leq 1$) on the second buffer layer, an active layer on the first cladding layer, and a second cladding layer on the active layer, wherein an Al content a of the first cladding layer is larger than an Al content y of the second buffer layer.

In one embodiment of the invention, the step (a) is performed at a growth temperature between about 600° C. and about 700° C.; the step (b) is performed while increasing a growth temperature from a temperature between about 600° C. and about 700° C. to a temperature between about 700° C. and about 850° C.; and the step (c) is performed at a growth temperature between about 700° C. to about 850° C.

In one embodiment of the invention, the vapor phase deposition method is an MOCVD method.

In one embodiment of the invention, the vapor phase deposition method is an MBE method.

In one embodiment of the invention, the principal plane of the GaAs substrate is inclined from the (100) plane toward the [011] orientation by an angle equal to or greater than about 2°.

In one embodiment of the invention, the Al content y of the second buffer layer is equal to or greater than about 0.3 and less than or equal to about 0.8.

In one embodiment of the invention, a growth temperature for the step (b) is different from that for the step (c).

In one embodiment of the invention, a growth temperature for the step (b) is equal to that for the first cladding layer in the step (c).

In one embodiment of the invention, a growth temperature for the step (a) is equal to that for the step (b).

In one embodiment of the invention, the step (b) is performed while changing a growth temperature therefor in a stepwise or continuous manner.

In one embodiment of the invention, the first cladding layer is grown in the step (c) while changing a growth temperature therefor in a stepwise or continuous manner.

In one embodiment of the invention, a current diffusing layer is provided on the second cladding layer.

In one embodiment of the invention, a current blocking layer is provided between the second cladding layer and the current diffusing layer.

In one embodiment of the invention, the current blocking layer is provided in a central portion of the semiconductor light emitting device.

In one embodiment of the invention, the current blocking layer is provided in a peripheral portion of the semiconductor light emitting device.

In one embodiment of the invention, the active layer is a quantum well active layer obtained by depositing a number of quantum well layers and a number of barrier layers in an alternating pattern.

In one embodiment of the invention, a current blocking layer is provided on the second cladding layer and a cap layer is provided on the current blocking layer.

In one embodiment of the invention, a light reflecting layer is provided closer to the GaAs substrate with respect to the first cladding layer.

In one embodiment of the invention, a growth temperature is increased after the step (b), and the step (c) is performed thereafter.

The functions of the present invention will now be described.

According to the present invention, the principal plane of the GaAs substrate is inclined from the (100) plane toward the [011] orientation. As a result, it is less likely that oxygen is introduced into the AlGaInP type semiconductor layer to be grown thereon, thereby obtaining a desirable crystallinity. In order for this effect to manifest itself sufficiently, it is preferred that the principal plane is inclined by an angle of equal to or greater than about 2°. On such an inclined principal plane, the first buffer layer of $Al_xGa_{1-x}As$ ($0 \leq x \leq 1$) is formed. As a result, the diffusion of an impurity from the substrate into the light emitting section is suppressed, and the planarity of the surface of the substrate is improved, i.e., the unevenness is reduced. Of course, the inclined plane orientation is conserved. Unlike the conventional buffer layer of GaInP or AlGaInP, the GaAs or AlGaAs first buffer layer of the present invention has the same composition as that of the substrate. As a result, unevenness is not introduced at the junction therebetween, and it is possible to grow thereon a buffer layer having a smaller number of defects and thus a desirable crystallinity with the inclined plane orientation being kept unchanged. Moreover, the AlGaInP first cladding layer is provided on the AlGaAs (or GAs) first buffer layer via the AlGaInP (or GaInP) second buffer layer. As a result, the crystallinity of the light emitting section, particularly the active layer, is significantly improved, thereby improving the emission efficiency. Alternatively, an AlGaInP (or GaInP) buffer layer structure including two or more layers therein may be provided on the AlGaAs (or GaAs) first buffer layer.

According to the present invention, the Al content s of the first cladding layer is larger than the Al content y of the second buffer layer. As a result, it is possible to obtain a semiconductor light emitting device in which the crystallinity of the light emitting section, particularly the active layer, is significantly improved, thereby improving the emission efficiency. For example, when a cladding layer having a large Al content is grown directly on a GaAs (or AlGaAs) buffer layer, a desirable crystallinity is not obtained. However, as in the present invention, when the second buffer layer having a small Al content is first grown on the GaAs (or AlGaAs) buffer layer, and then the first cladding layer having a large Al content is grown on the second buffer layer, an improved crystallinity is obtained. Alternatively, the composition of the second buffer layer and/or the first cladding layer may be changed gradually. The change of the composition may be either stepwise or continuous.

The Al content y of the second buffer layer is preferably equal to or greater than about 0.3 and less than or equal to about 0.8. In such a case, it is possible to obtain a semiconductor light emitting device in which the crystallinity of the light emitting section, particularly the active layer, is significantly improved, thereby improving the emission efficiency.

The growth temperature for the second buffer layer may be different from that for the first cladding layer. For example, a cladding layer having a large Al content (the first cladding layer) may be grown at a higher growth temperature while a buffer layer having a small Al content (the second buffer layer) may be grown at a lower growth temperature, because the optimal growth temperature for an AlGaInP layer having a large Al content is relatively high.

The growth temperature for the second buffer layer may be changed gradually (in a stepwise or continuous manner). For example, the second buffer layer may be grown while increasing the growth temperature during the growth process from the optimal growth temperature for the GaAs (or AlGaAs) first buffer layer to the optimal growth temperature for the AlGaInP (or GaInP) second buffer layer. In such a case, the crystallinity can be further improved. Similarly, the growth temperature for the first cladding layer may be changed gradually.

A current diffusing layer may be provided on the second cladding layer. In such case, the injected current flow can be diffused through the current diffusing layer so as to efficiently utilize the entire active layer for emitting light, thereby significantly improving the emission efficiency.

A current blocking layer may be provided between the second cladding layer and the current diffusing layer. In such a case, the injected current flow can be even better diffused through the current diffusing layer so as to more efficiently utilize the entire active layer for emitting light, thereby further improving the emission efficiency.

The current blocking layer may be provided in the central portion of the device. In such a case, it is possible to diffuse the injected current flow toward the peripheral portion of the device and to efficiently extract the generated light from the device. Alternatively, the current blocking layer may be provided in a peripheral portion of the device. In such a case, it is possible to localize the current flow to the central portion of the device, thereby increasing the current density, and to efficiently extract the generated light from the device.

A light reflecting layer may be provided closer to the GaAs substrate with respect to the first cladding layer. In such a case, a portion of the generated light, which would otherwise be absorbed by the substrate, can be reflected by the light reflecting layer so that it can be extracted from the device, thereby significantly improving the efficiency of use of the generated light.

The present invention can be used to provide a semiconductor laser device by providing a current blocking layer and a cap layer on the second cladding layer.

Thus, the invention described herein makes possible the advantage of providing a semiconductor light emitting device including a GaAs substrate whose principal plane is inclined from the (100) plane toward the [011] orientation, on which an AlGaInP type semiconductor layer with a desirable crystallinity is grown, thereby significantly improving the emission efficiency.

This and other advantages of the present invention will become apparent to those skilled in the art upon reading and understanding the following detailed description with reference to the accompanying figures.

DESCRIPTION OF THE PREFERRED EMBODIMENTS

Various embodiments of the present invention will now be described with reference to the accompanying drawings. In the following description of the embodiments of the present invention, an MOCVD method is used for growing semiconductor layers. However, the growth method is not limited to this, and may alternatively be any other growth method such as an MBE method, a vapor deposition method, or the like. The effects of the present invention can be sufficiently obtained when the composition of each semiconductor layer is appropriately modified from that shown in the following description. Moreover, the structure of the device may also be modified from that shown in the following description. The present invention is applicable to any semiconductor light emitting device such as a semiconductor laser device, a light emitting diode, or the like.

Embodiment 1

As one embodiment of the semiconductor light emitting device of the present invention, an AlGaInP type light emitting diode will now be described.

Figure 1A:
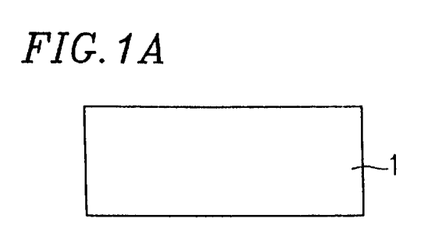
FIGS. 1A to 1D are cross-sectional views illustrating the process of producing a semiconductor light emitting device according to Embodiment 1 of the present invention.
Figure 1B:
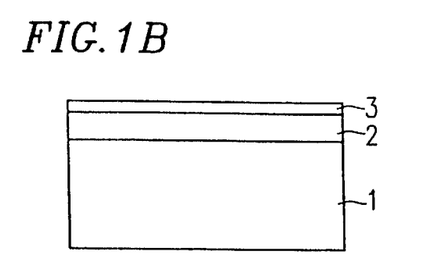
Figure 1C:
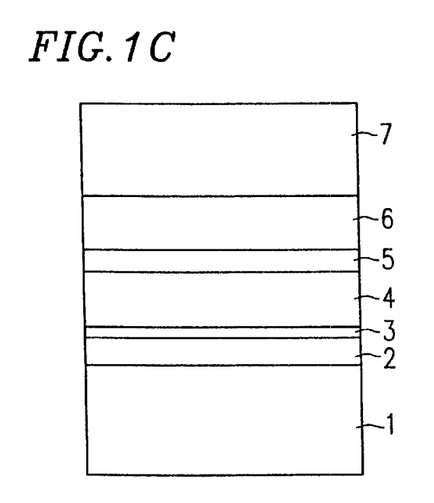
Figure 1D:
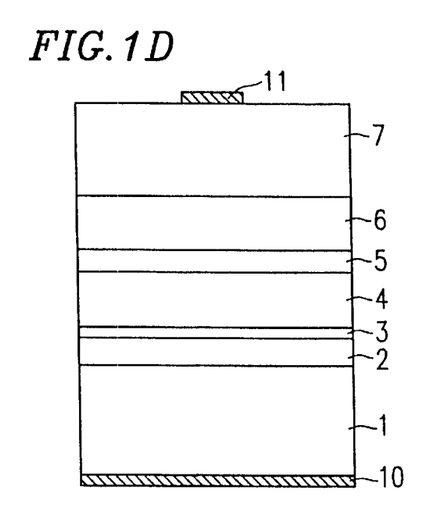

FIG. 1D is a schematic cross-sectional view illustrating the structure of the light emitting diode of the present embodiment. The light emitting diode includes an n-GaAs substrate 1 whose principal plane is inclined from the (100) plane toward the [011] orientation. The light emitting diode further includes an n-$Al_xGa_{1-x}As$ ($0 \leq x \leq 1$) first buffer layer 2, an n-$Al_yGa_zIn_{1-y-z}P$ ($0 \leq y \leq 1$ and $0 \leq z \leq 1$) second buffer layer 3, an n-$Al_sGa_tIn_{1-s-t}P$ ($0 \leq s \leq 1$ and $0 \leq t \leq 1$) first cladding layer 4, an $Al_aGa_bIn_{1-a-b}P$ ($0 \leq a \leq 1$ and $0 \leq b \leq 1$) active layer 5, a p-$Al_cGa_dIn_{1-c-d}P$ ($0 \leq c \leq 1$ and $0 \leq d \leq 1$) second cladding layer 6, and an $In_fAl_gGa_{1-f-g}P$ ($0 < f < 1$ and $0 < g < 1$) current diffusing layer 7, which are deposited on the n-GaA substrate 1. An electrode 11 is provided in the central portion of the top surface of the layered structure, and another electrode 10 is provided on the reverse side of the n-GaAs substrate 1.

The light emitting diode can be produced as follows, for example.

First, the n-GaAs substrate 1 whose principal plane is inclined from the (100) plane toward the [011] orientation by an angle of about 15° is provided as shown in FIG. 1A. Then, as shown in FIG. 1B, the first buffer layer 2 and the second buffer layer 3 are grown on the n-GaAs substrate 1 by using an MOCVD method. The first buffer layer 2 has a thickness of about 0.5 μm and a composition of n-$Al_xGa_{1-x}As$ ($0 \leq x \leq 1$; in this example, x=0 and the Si concentration is about $5 \times 10^{17}$ $cm^{-3}$, for example). The second buffer layer 3 has a thickness of about 0.05 μm and a composition of n-$Al_yGa_zIn_{1-y-z}P$ ($0 \leq y \leq 1$ and $0 \leq z \leq 1$; in this example, y=0.3 and z=0.5, and the Si concentration is about $5 \times 10^{17}$ $cm^{-3}$, for example). First, the first buffer layer 2 is grown at a growth temperature of about 600° C. to about 700° C., and then the second buffer layer 3 is grown while increasing the growth temperature from a temperature of about 600° C. to about 700° C. to another temperature of about 700° C. to about 850° C.

Then, as shown in FIG. 1C, the first cladding layer 4, the active layer 5, the second cladding layer 6 and the current diffusing layer 7 are deposited in this order at a growth temperature of about 700° C. to about 850° C. The first cladding layer 4 has a thickness of about 1.0 µm and a composition of n-Al$_s$Ga$_t$In$_{1-s-t}$P (0≦s≦1 and 0≦t≦1; in this example, s=0.5, t=0.0, and the Si concentration is about 5×10$^{17}$ cm$^{-3}$, for example). The active layer 5 has a thickness of about 0.5 µm and a composition of Al$_a$Ga$_b$In$_{1-a-b}$P (0≦a≦1 and 0≦b≦1; in this example, a=0.4 and b=0.5, for example). The second cladding layer 6 has a thickness of about 1.0 µm and a composition of p-Al$_c$Ga$_d$In$_{1-c-d}$P (0≦c≦1 and 0≦d≦1; in this example, c=0.5, d=0.5, and the Zn concentration is about 5×10$^{17}$ cm$^{-3}$, for example). The current diffusing layer 7 has a thickness of about 5 µm and a composition of p-In$_f$Al$_g$Ga$_{1-f-g}$P (0<f<1 and 0<g<1; in this example, f=0.01, g=0.01, and the Zn concentration is about 5×10$^{18}$ cm$^{-3}$, for example).

Then, as shown in FIG. 1D, the electrodes 10 and 11 are formed, thereby completing the light emitting diode.

As described above, according to the present embodiment, the principal plane of the n-GaAs substrate 1 is inclined from the (100) plane toward the [011] orientation by an angle of about 15°. The buffer layer employs a two-layer structure including the n-AlGaAs (or GaAs) first buffer layer 2 and the AlGaInP (or GaInP) second buffer layer 3. The Al content s (s=0.5 in the present embodiment) of the first cladding layer 4 is larger than the Al content y (y=0.3 in the present embodiment) of the second buffer layer 3. As a result, the crystallinity of the light emitting section, particularly the active layer 5, is significantly improved, thereby significantly improving the emission efficiency. In another embodiment, s may be 1.0 and y may be 0.6 for example. These effects will be further discussed below.

First, the effects of inclining the principal plane of the GaAs substrate 1 from the (100) plane toward the [011] orientation will be described below.

Figure 2A:
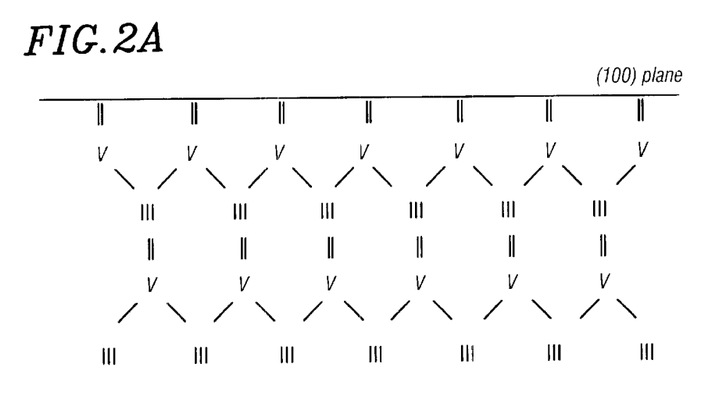
FIGS. 2A and 2B illustrate models of crystalline surfaces of a group III–V semiconductor substrate.
Figure 2B:
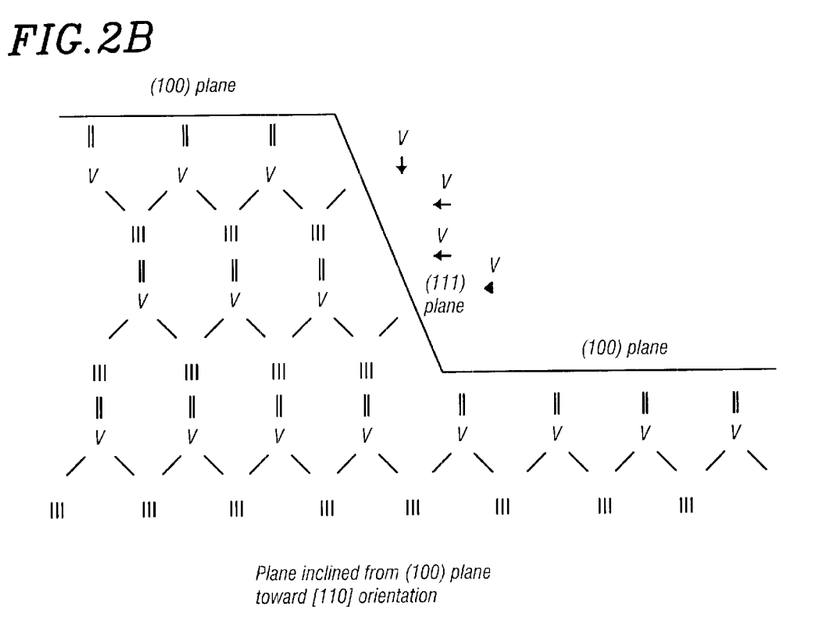

FIG. 2A illustrates a model of the surface of a group III–V crystal just along the (100) plane, and FIG. 2B illustrates a model of the surface of a group III–V crystal which is inclined from the (100) plane toward the [011] orientation. Herein, the group III element may be Ga, Al, In, or the like, and the group V element may be As, P, or the like. As shown in FIG. 2A, the principal plane of the group III–V crystal which is along the (100) plane is covered with group V atoms each having a double bond. On the contrary, as shown in FIG. 2B, the surface of the group III–V crystal whose principal plane is inclined toward the [011] orientation includes (111) planes which occur at regular intervals (a few tens of micrometers) along the surface of the group III–V crystal. The (111) plane is a crystalline plane which is covered with group III atoms each having a single bond. In the model shown in FIG. 2B, the surface of the group III–V crystal includes a (111) step (i.e., a stepped portion in the principal plane of the group III–V crystal which corresponds to the (111) plane) for every few tens of micrometers along the surface of the crystal, and the principal plane of the group III–V crystal is accordingly inclined from the (100) plane. Since the (111) plane is covered with group III atoms each having a single bond, group v atoms supplied thereto (P atoms in this example) bind to the group III atoms. However, the bond is easily broken because the bond is a single bond. Thus, the group V atoms will be migrating along this plane.

Herein, one possible factor which may reduce the emission efficiency in the Al$_a$Ga$_b$In$_{1-a-b}$P (0≦a≦1 and 0≦b≦1) active layer 5 is the introduction of O (oxygen) atoms into the active layer 5. When O (oxygen) atoms are introduced into an AlGaInP crystal, the O (oxygen) atoms form a non-radiative level, whereby non-radiative recombination occurs when carriers are injected into the crystal. Because O (oxygen) is a group VI element, the O (oxygen) atoms can easily take the group V site lattice positions. However, the O (oxygen) atoms cannot easily take the group V site lattice positions along the principal plane which is inclined from the (100) plane toward the [011] orientation because the group V atoms are migrating along the principal plane, as described above, and thus a large number of group V atoms exist along the crystalline surface. Thus, it is possible to reduce the amount of O (oxygen) to be introduced into the n-Al$_y$Ga$_z$In$_{1-y-z}$P (0≦y≦1 and 0≦z≦1) second buffer layer 3, the n-Al$_s$Ga$_t$In$_{1-s-t}$P (0≦s≦1 and 0≦t≦1) first cladding layer 4, the Al$_a$Ga$_b$In$_{1-a-b}$P (0≦a≦1 and 0≦b≦1) active layer 5 and the p-Al$_c$Ga$_d$In$_{1-c-d}$P (0≦c≦1 and 0≦d≦1) second cladding layer 6, thereby significantly improving the emission efficiency. Moreover, as described above, the (111) steps are formed at regular intervals. On such steps, a laminar growth (which results in a desirable crystallinity) is likely to occur. As a result, the depth of unevenness in the surface of the crystal is significantly reduced, thereby improving the planarity and crystallinity of the crystal.

Figure 10:
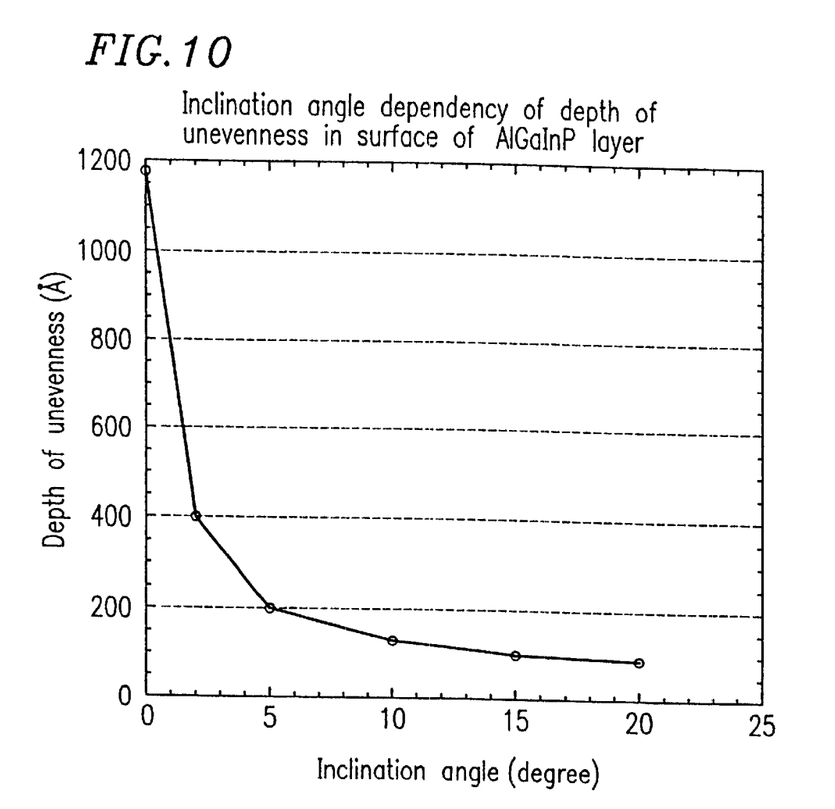
FIG. 10 illustrates the dependency of the depth (degree) of unevenness in the surface of the AlGaInP layer on the inclination angle of the principal plane of the substrate.

FIG. 10 shows the results of a measurement for the depth of unevenness in the surface of an Al$_j$Ga$_k$In$_{1-j-k}$P (j=0.5 and k=0.0) layer which is formed on each of various n-GaAs substrates whose principal planes are inclined from the (100) plane toward the [011] orientation by angles ranging from 0° to about 20°. As can be seen from FIG. 10, unevenness having a depth over 1000 angstroms occurs when the principal plane is not inclined from the (100) plane (i.e., when the inclination angle is 0°). On the contrary, the depth of unevenness is significantly reduced when the principal plane is inclined by an angle equal to or greater than about 2°. The inclination angle is preferably in a range of about 5° to about 20° (inclination angles over 20° may lead to an undesirable increase in the production cost). Particularly, when the inclination is about 15° or more, the depth of unevenness is reduced to about 100 angstroms or less, thereby realizing a desirable crystallinity.

Second, the effects of employing, for the buffer layer, a two-layer structure including the n-AlGaAs (or GaAs) first buffer layer 2 and the AlGaInP (or GaInP) second buffer layer 3 will be described below.

As a result of providing the n-AlGaAs first buffer layer 2 on the n-GaAs substrate 1, the diffusion of an impurity from the substrate into the light emitting section is suppressed, and the planarity of the surface of the substrate is improved, i.e., the unevenness is reduced. Of course, the inclined plane orientation is conserved. These effects are similarly obtained also when an n-Al$_x$Ga$_{1-x}$As (0≦x≦1) first buffer layer is provided on the n-GaAs substrate 1. The Al content x is preferably 0≦x≦0.2. On the contrary, when a GaInP or AlGaInP buffer layer is provided as in the prior art, the composition of the buffer layer is different from that of the substrate, thereby introducing unevenness at the junction therebetween or defects in the buffer layer.

Third, the effects of setting the Al content a of the first cladding layer 4 to be larger than the Al content y of the second buffer layer 3 while varying the growth temperature for different layers will be described below.

When a AlGaInP first cladding layer having a large Al content was grown directly on the GaAs first buffer layer, the growth interface was not steep, and a desirable crystallinity was not obtained due to the significant composition difference between these layers. In view of this, according to the present embodiment, the n-$Al_yGa_zIn_{1-y-z}P$ ($0 \leq y \leq 1$ and $0 \leq z \leq 1$) second buffer layer 3 having an n-$Al_sGa_tIn_{1-s-t}P$ ($0 \leq s \leq 1$ Al content smaller than that of the and $0 \leq t \leq 1$) first cladding layer 4 is grown on the GaAs first buffer layer 2. Thus, it is possible to obtain a desirable growth interface, and to obtain the first cladding layer 4 having a desirable crystallinity. When the AlGaInP buffer layer 3 has an Al content larger than that of InGaP, and thus the composition type of the AlGaInP buffer layer 3 is the same as that of the upper cladding layer, it is possible to obtain a desirable growth interface. When the AlGaInP buffer layer 3 has an Al content smaller than that of the cladding layer 4, the crystallinity is improved. Particularly, it is most preferred that the Al content y of the second buffer layer is equal to or greater than about 0.3 and less than or equal to about 0.8.

The optimal growth temperature for the GaAs first buffer layer 2 is about 650° C. to about 720° C. The growth temperature for an AlGaInP layer is preferably equal to or greater than about 700° C. Particularly, a layer having a large Al content such as an AlInP layer is preferably grown at a high temperature. In view of this, according to the present embodiment, the crystallinity is significantly improved by growing the $Al_yGa_zIn_{1-y-z}P$ ($0 \leq y \leq 1$ and $0 \leq z \leq 1$) second buffer layer 3 (between the GaAs first buffer layer 2 and the $Al_sGa_tIn_{1-s-t}P$ ($0 \leq s \leq 1$ and $0 \leq t \leq 1$) first cladding layer 4) while increasing the growth temperature from the optimal growth temperature for GaAs first buffer layer 2 to the optimal growth temperature for the $Al_sGa_tIn_{1-s-t}P$ ($0 \leq s \leq 1$ and $0 \leq t \leq 1$) first cladding layer 4 (which has a large Al content). These effects are similarly obtained also when an n-$Al_xGa_{1-x}As$ ($0 \leq x \leq 1$) first buffer layer is provided.

In the present embodiment, the $Al_yGa_zIn_{1-y-z}P$ ($0 \leq y \leq 1$ and $0 \leq z \leq 1$) second buffer layer 3 is grown while increasing the growth temperature therefor. However, for the reasons described above, similar effects were obtained when the second buffer layer 3 was grown at a temperature equal to the optimal growth temperature for the n-GaAs first buffer layer 2, a temperature equal to the optimal growth temperature for the $Al_sGa_tIn_{1-s-t}P$ ($0 \leq s \leq 1$ and $0 \leq t \leq 1$) first cladding layer 4, or another temperature therebetween.

(Embodiment 2)

As another embodiment of the semiconductor light emitting device of the present invention, an AlGaInP type semiconductor laser device will now be described.

Figure 3:
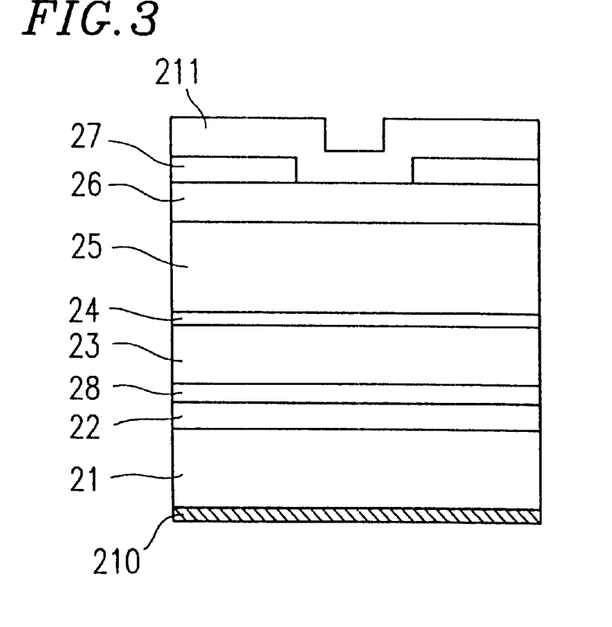
FIG. 3 is a schematic cross-sectional view illustrating a structure of a semiconductor light emitting device according to Embodiment 2 of the present invention.

FIG. 3 is a schematic cross-sectional view illustrating a structure of the semiconductor laser device of the present embodiment. The semiconductor laser device includes an n-GaAs substrate 21 whose principal plane is inclined from the (100) plane toward the [011] orientation by an angle of about 10. The semiconductor laser device further includes a first buffer layer 22, a second buffer layer 28, a first cladding layer 23, a quantum well active layer 24, a second cladding layer 25, and a cap layer 26, which are deposited on the n-Gas substrate 21. The first buffer layer 22 has a thickness of about 0.5 µm and a composition of n-$Al_xGa_{1-x}As$ ($0 \leq x \leq 1$; in this example, x=0 and the Si concentration is about $5 \times 10^{17}$ cm$^{-3}$, for example). The second buffer layer 28 has a thickness of about 0.5 µm and a composition of n-$Al_yGa_zIn_{1-y-z}P$ ($0 \leq y \leq 1$ and $0 \leq z \leq 1$; in this example, y=0.3, z=0.0, and the Si concentration is about $5 \times 10^{17}$ cm$^{-3}$, for example). The first cladding layer 23 has a thickness of about 1.0 µm and a composition of n-$Al_sGa_tIn_{1-s-t}P$ ($0 \leq s \leq 1$ and $0 \leq t \leq 1$; in this example, s=0.5, t=0.0, and the Si concentration is about $5 \times 10^{17}$ cm$^{-3}$, for example). The quantum well active layer 24 has an alternating multi-layer structure including five quantum well layers of $Al_aGa_bIn_{1-a-b}P$ ($0 \leq a \leq 1$ and $0 \leq b \leq 1$; in this example, a=0 and b=0.5, for example) each having a thickness of about 10 nm and six barrier layers of $Al_aGa_bIn_{1-a-b}P$ ($0 \leq a \leq 1$ and $0 \leq b \leq 1$; in this example, a=0.3 and b=0.5, for example). The second cladding layer 25 has a thickness of about 1.0 µm and has a composition of $Al_cGa_cIn_{1-c-c}P$ ($0 \leq c \leq 1$ and $0 \leq d \leq 1$; in this example, c=0.5, d=0.5, and the Zn concentration is about $5 \times 10^{17}$ cm$^{-3}$, for example). The cap layer 26 has a thickness of about 1 µm and a composition of p-GaAs (herein, the Zn concentration is about $1 \times 10^{18}$ cm$^{-3}$). An insulation film 27 made of $SiO_2$, or the like, is provided on the cap layer 26, and the central portion of the insulation film 27 is etched in a stripe pattern, thereby providing a current path. An electrode 211 is provided on the insulation film 27, and another electrode 210 is provided on the reverse side of the substrate.

In the semiconductor laser device of the present embodiment, as in Embodiment 1, the effects of inclining the principal plane of the n-GaAs substrate 21 from the (100) plane toward the [011] orientation are significantly pronounced by employing, for the buffer layer, a two-layer structure including the n-$Al_xGa_{1-x}As$ ($0 \leq x \leq 1$) first buffer layer 22 and the n-$Al_yGa_zIn_{1-y-z}P$ ($0 \leq y \leq 1$ and $0 \leq z \leq 1$) second buffer layer 28, and setting the Al content of the substrate-side cladding layer (the first cladding layer 23) to be greater than that of the second buffer layer 28.

Figure 4:
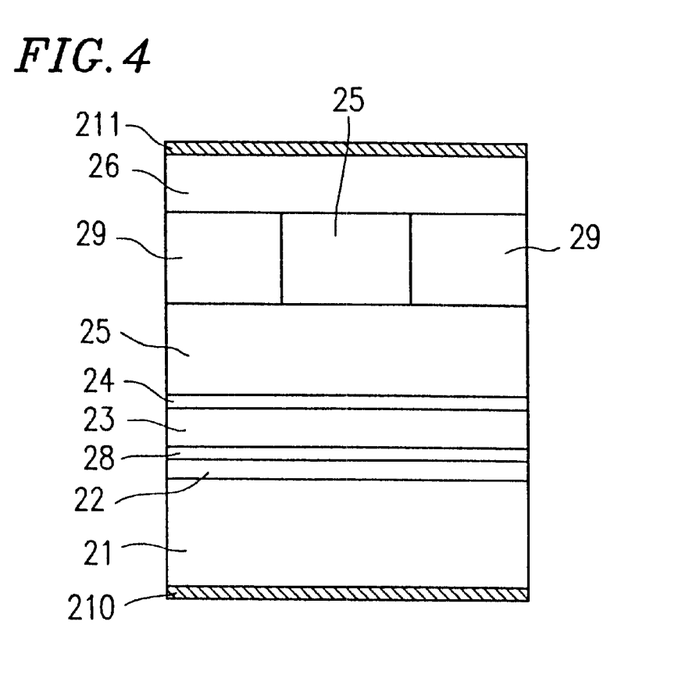
FIG. 4 is a schematic cross-sectional view illustrating a structure of another semiconductor light emitting device according to Embodiment 2 of the present invention.

FIG. 4 illustrates the structure of another semiconductor laser device according to Embodiment 2 of the present invention. The semiconductor laser device includes a current blocking layer 29 and the cap layer 26. In such a case, it is possible to localize the current flow to the central portion of the active layer, thereby increasing the current density.

(Embodiment 3)

As still another embodiment of the semiconductor light emitting device of the present invention, an AlGaInP type semiconductor light emitting diode will now be described. Embodiment 3 is the same as Embodiment 1 except (i) that the inclination angle of the principal plane of the substrate is set to about 5°, (ii) that the growth temperature for the second buffer layer is equal to that for the first cladding layer, and (iii) that a light reflecting layer is provided.

Figure 5:
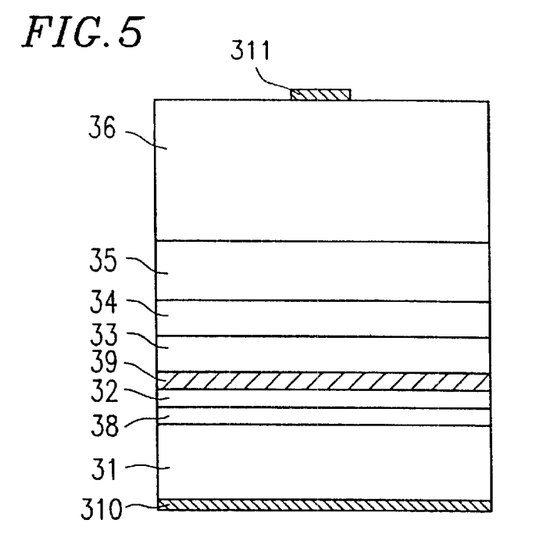
FIG. 5 is a schematic cross-sectional view illustrating a structure of a semiconductor light emitting device according to Embodiment 3 of the present invention.

FIG. 5 is a schematic cross-sectional view illustrating the structure of a light emitting diode of the present embodiment. The light emitting diode includes an n-GaAs substrate 31 whose principal plane is inclined from the (100) plane toward the [011] orientation by an angle of about 5°. The light emitting diode further includes an n-$Al_xGa_{1-x}As$ ($0 \leq x \leq 1$) first buffer layer 38, an n-$Al_yGa_zIn_{1-y-z}P$ ($0 \leq y \leq 1$ and $0 \leq z \leq 1$) second buffer layer 32, an n-AlAs/GaAs light reflecting layer 39, an n-$Al_sGa_tIn_{1-s-t}P$ ($0 \leq s \leq 1$ and $0 \leq t \leq 1$) first cladding layer 33, an $Al_aGa_bIn_{1-a-b}P$ ($0 \leq a \leq 1$ and $0 \leq b \leq 1$) active layer 34, a p-$Al_cGa_dIn_{1-c-d}P$ ($0 \leq c \leq 1$ and $0 \leq d \leq 1$) second cladding layer 35, and an $In_fAl_gGa_{1-f-g}P$ ($0<f<1$ and $0<g<1$) current diffusing layer 36, which are deposited on the n-GaAs substrate 31. An electrode 311 is provided on the current diffusing layer 36, and another electrode 310 is provided on the reverse side of the n-GaAs substrate 31.

The light emitting diode can be produced as follows, for example.

First, the n-GaAs substrate 31 whose principal plane is inclined from the (100) plane toward the [011] orientation by an angle of about 5° is provided. Then, the n-$Al_xGa_{1-x}As$ ($0 \leq x \leq 1$; in this example, x=0 and the Si concentration is about $5 \times 10^{17}$ cm$^{-3}$, for example) first buffer layer 38 having a thickness of about 0.5 µm is grown on the n-GaAs substrate 31 by an MOCVD method at a growth temperature of about 600° C. to about 700° C.

Then, the second buffer layer 32, the light reflecting layer 39, the first cladding layer 33, the active layer 34, the second cladding layer 35 and the current diffusing layer 36 are deposited in this order on the first buffer layer 38 at a growth temperature of about 700° C. to about 850° C. The second buffer layer 32 has a thickness of about 0.05 μm and a composition of n-Al$_y$Ga$_z$In$_{1-y-z}$P (0≦y≦1 and 0≦z≦1; in this example, y=0.3, z=0.0, and the Si concentration is about 5×10$^{17}$ cm$^{-3}$, for example). The light reflecting layer 39 has a composition of n-AlAs/GaAs and includes ten pairs of n-AlAs/GaAs layers each pair having a thickness of about 100 angstroms, for example. The first cladding layer 33 has a thickness of about 1.0 μm and a composition of n-Al$_s$Ga$_t$In$_{1-s-t}$P (0≦s≦1 and 0≦t≦1; in this example, s=0.5, t=0.0, and the Si concentration is about 5×10$^{17}$ cm$^{-3}$, for example). The active layer 34 has a thickness of about 0.5 μm and a composition of Al$_a$Ga$_b$In$_{1-a-b}$P (0≦a≦1 and 0≦b≦1; in this example, a=0.4 and b=0.5, for example). The second cladding layer 35 has a thickness of about 1.0 μm and a composition of p-Al$_c$Ga$_d$In$_{1-c-d}$P (0≦c≦1 and 0≦d≦1; in this example, c=0.5, d=0.5, and the Zn concentration is about 5×10$^{17}$ cm$^{-3}$, for example). The current diffusing layer 36 has a thickness of about 5 μm and a composition of In$_f$Al$_g$Ga$_{1-f-g}$P (0<f<1 and 0<g<1; in this example, f=0.01, g=0.01, and the Zn concentration is about 5×10$^{18}$ cm$^{-3}$, for example). Then, the electrodes 311 and 310 are formed, thereby completing the light emitting diode.

In the light emitting diode of the present embodiment, as in Embodiment 1, the effects of inclining the principal plane of the n-GaAs substrate 31 from the (100) plane toward the [011] orientation are significantly pronounced by employing, for the buffer layer, a two-layer structure including the n-Al$_x$Ga$_{1-x}$As (0≦x≦1) first buffer layer 38 and the n-Al$_y$Ga$_z$In$_{1-y-z}$P (0≦y≦1 and 0≦z≦1) second buffer layer 32, and setting the Al content of the substrate-side cladding layer (the first cladding layer 33) to be greater than that of the second buffer layer 32. As a result, the crystallinity of the light emitting section, particularly the active layer 34, is significantly improved, thereby significantly improving the emission efficiency. In the present embodiment, the light reflecting layer 39 is provided between the second buffer layer 32 and the first cladding layer 33. In the present embodiment, effects similar to those of Embodiment 1 were obtained.

Where the growth temperature for the second buffer layer is equal to that for the first cladding layer as in the present embodiment, it is possible to obtain a steeper growth interface, and thus a better crystallinity, than those obtained when growing the first cladding layer directly on the first buffer layer by appropriately setting the composition of the second buffer layer to be different from that of the first cladding layer. Moreover, in the present embodiment, the principal plane of the substrate is inclined from the (100) plane toward the [011] orientation by an angle of about 5°. As a result, the production cost of the substrate can be lower than that of the substrate of Embodiment 1 whose inclination angle is about 15°.

In the present embodiment, the light reflecting layer 39 is provided. As a result, a portion of the generated light, which would otherwise be absorbed by the substrate 31, can be reflected by the light reflecting layer 39 so that it can be extracted from the device, thereby improving the efficiency of use of the generated light.

(Embodiment 4)

As still another embodiment of the semiconductor light emitting device of the present invention, an AlGaInP type light emitting diode will now be described. Embodiment 4 is the same as Embodiment 1 except that (i) the growth temperature is increased after the second buffer layer is formed, and (ii) the first cladding layer is grown thereafter.

Figure 6:
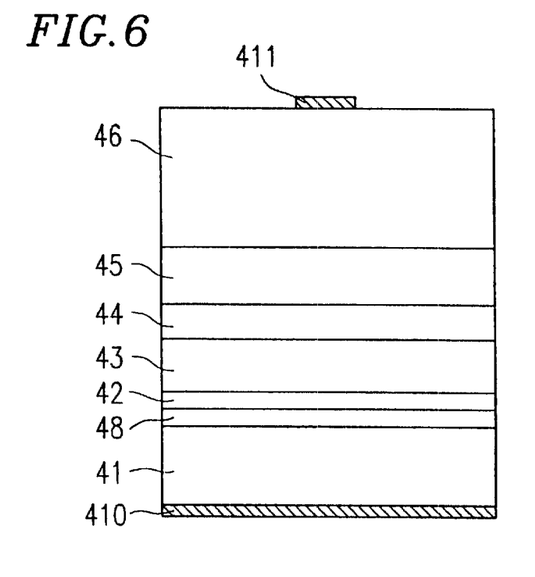
FIG. 6 is a schematic cross-sectional view illustrating a structure of a semiconductor light emitting device according to Embodiment 4 of the present invention.

FIG. 6 is a schematic cross-sectional view illustrating the structure of the light emitting diode of the present embodiment. The light emitting diode includes an n-GaAs substrate 41 whose principal plane is inclined from the (100) plane toward the [011] orientation by an angle of about 2°. The light emitting diode further includes an n-Al$_x$Ga$_{1-x}$As (0≦x≦1) first buffer layer 48, an n-Al$_y$Ga$_z$In$_{1-y-z}$P (0≦y≦1 and 0≦z≦1) second buffer layer 42, an n-Al$_s$Ga$_t$In$_{1-s-t}$P (0≦s≦1 and 0≦t≦1) first cladding layer 43, an Al$_a$Ga$_b$In$_{1-a-b}$P (0≦a≦1 and 0≦b≦1) active layer 44, a p-Al$_c$Ga$_d$In$_{1-c-d}$P (0≦c≦1 and 0≦d≦1) second cladding layer 45, and an In$_f$Al$_g$Ga$_{1-f-g}$P (0<f<1 and 0<g<1) current diffusing layer 46, which are deposited on the n-GaAs substrate 41. An electrode 411 is provided on the current diffusing layer 46, and another electrode 410 is provided on the reverse side of the n-GaAs substrate 41

The light emitting diode can be produced as follows, for example.

First, the n-GaAs substrate 41 whose principal plane is inclined from the (100) plane toward the [011] orientation by an angle of about 2° is provided. Then, the first buffer layer 48 and the second buffer layer 42 are grown on the n-GaAs substrate 41 by an MOCVD method at a growth temperature of about 600° C. to about 700° C. The first buffer layer 48 has a thickness of about 0.5 μm and a composition of n-Al$_x$Ga$_{1-x}$As (0≦x≦1; in this example, x=0 and the Si concentration is about 5×10 cm$^{-3}$, for example). The second buffer layer 42 has a thickness of about 0.05 μm and a composition of n-Al$_y$Ga$_z$In$_{1-y-z}$P (0≦y≦1 and 0≦z≦1; in this example, y=0.3, z=0.0, and the Si concentration is about 5×10$^{17}$ cm$^{-3}$, for example).

Then, the growth temperature is increased to a temperature of about 700° C. to about 850° C., after which the first cladding layer 43, the active layer 44, the second cladding layer 45, and the current diffusing layer 46 are deposited in this order on the second buffer layer 42. The first cladding layer 43 has a thickness of about 1.0 μm and a composition of n-Al$_s$Ga$_t$In$_{1-s-t}$P (0≦s≦1 and 0≦t≦1) in this example, s=0.5, t=0.0, and the Si concentration is about 5×10$^{17}$ cm$^{-3}$, for example). The active layer 44 has a thickness of about 0.5 μm and a composition of Al$_a$Ga$_b$In$_{1-a-b}$P (0≦a≦1 and 0≦b≦1; in this example, a=0.4 and b=0.5, for example). The second cladding layer 45 has a thickness of about 1.0 μm and a composition of p-Al$_c$Ga$_d$In$_{1-c-d}$P (0≦c≦1 and 0≦d≦1; in this example, a=0.5, d=0.5, and the Zn concentration is about 5×10$^{17}$ cm$^{-3}$, for example). The current diffusing layer 46 has a thickness of about 5 μm and a composition of In$_f$Al$_g$Ga$_{1-f-g}$P (0<f<1 and 0<g<1, in this example, f=0.01, g=0.01, and the Zn concentration is about 5×10$^{18}$ cm$^{-3}$, for example). Then, the electrodes 411 and 410 are formed, thereby completing the light emitting diode.

In the light emitting diode of the present embodiments as in Embodiment 1, the effects of inclining the principal plane of the n-GaAs substrate 41 from the (100) plane toward the [011] orientation are significantly pronounced by employing, for the buffer layer, a two-layer structure including the n-Al$_x$Ga$_{1-x}$As (0≦x≦1) first buffer layer 48 and the n-Al$_y$Ga$_z$In$_{1-y-z}$P (0≦y≦1 and 0≦z≦1) second buffer layer 42, and setting the Al content of the substrate-side cladding layer (the first cladding layer 43) to be greater than that of the second buffer layer 42. As a result, the crystallinity of the light emitting section, particularly the active layer 44, is significantly improved, thereby significantly improving the emission efficiency.

(Embodiment 5)

As still another embodiment of the semiconductor light emitting device of the present invention, an AlGaInP type light emitting diode will now be described. Embodiment 5 is the same as Embodiment 1 except that a current blocking layer 58 is provided in the central portion of the device, between a second cladding layer 55 and a current diffusing layer 56.

Figure 7:
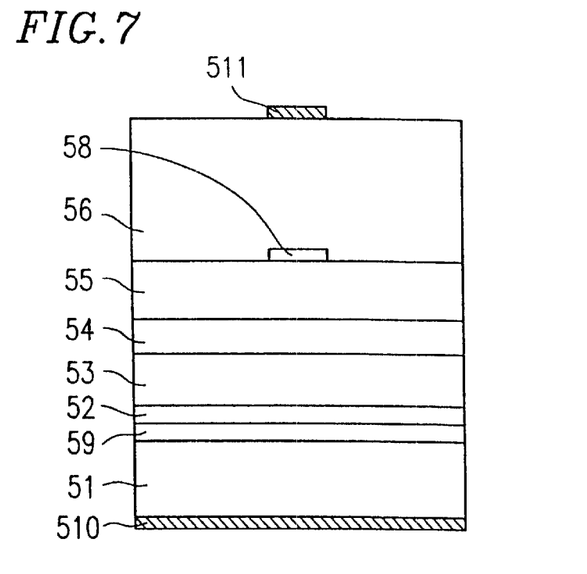
FIG. 7 is a schematic cross-sectional view illustrating a structure of a semiconductor light emitting device according to Embodiment 5 of the present invention.

FIG. 7 is a schematic cross-sectional view illustrating the structure of the light emitting diode of the present embodiment. The light emitting diode includes an n-GaAs substrate 51 whose principal plane is inclined from the (100) plane toward the [011] orientation by an angle of about 15°. The light emitting diode further includes a first buffer layer 59, a second buffer layer 52, a first cladding layer 53, an active layer 54, and the second cladding layer 55. The first buffer layer 59 has a thickness of about 0.5 μm and a composition of n-$Al_xGa_{1-x}As$ ($0 \leq x \leq 1$; in this example, x=0 and the Si concentration is about $5 \times 10^{17}$ cm$^{-3}$, for example). The second buffer layer 52 has a thickness of about 0.05 μm and a composition of n-$Al_yGa_zIn_{1-y-z}P$ ($0 \leq y \leq 1$ and $0 \leq z \leq 1$; in this example, y=0.3, z=0.0, and the Si concentration is about $5 \times 10^{17}$ cm$^{-3}$, for example). The first cladding layer 53 has a thickness of about 1.0 μm and a composition of n-$Al_sGa_tIn_{1-s-t}P$ ($0 \leq s \leq 1$ and $0 \leq t \leq 1$; in this example, s=0.5, t=0.0, and the Si concentration is about $5 \times 10^{17}$ cm$^{-3}$, for example). The active layer 54 has a thickness of about 0.5 μm and a composition of $Al_aGa_bIn_{1-a-b}P$ ($0 \leq a \leq 1$ and $0 \leq b \leq 1$; in this example, a=0.4 and b=0.5, for example). The second cladding layer 55 has a thickness of about 1.0 μm and a composition of p-$Al_cGa_dIn_{1-c-d}P$ ($0 \leq c \leq 1$ and $0 \leq d \leq 1$; in this example, c=0.5, d=0.5, and the Zn concentration is about $5 \times 10^{17}$ cm$^{-3}$, for example). A current blocking layer 58 is provided in the central portion of the top surface of the second cladding layer 55. The current blocking layer 58 has a thickness of about 0.5 μm and a composition of n-GaP (herein, the Zn concentration is about $1 \times 10^{19}$ cm$^{-3}$). The current diffusing layer 56 is deposited on the current blocking layer 58 and the exposed surface of the second cladding layer 55. The current diffusing layer 56 has a thickness of about 5 μm and a composition of $In_fAl_gGa_{1-f-g}P$ ($0 < f < 1$ and $0 < g < 1$ in this example, f=0.01, g=0.01, and the Zn concentration is about $5 \times 10^{18}$ cm$^{-3}$, for example). An electrode 511 is provided on the current diffusing layer 56, and another electrode 510 is provided on the reverse side of the n-GaAs substrate 51.

In the light emitting diode of the present embodiment, the current blocking layer 58 is provided in the central portion of the device, between the second cladding layer 55 and the current diffusing layer 56. As a result, the current injected from the electrode 511 is further diffused through the current diffusing layer 56, thereby further improving the light extraction efficiency.

(Embodiment 6)

As still another embodiment of the semiconductor light emitting device of the present invention, an AlGaInP type light emitting diode will now be described. Embodiment 6 is the same as Embodiment 5 except that a current blocking layer 68 is provided in the peripheral portion of the device, between a second cladding layer 65 and a current diffusing layer 66.

Figure 8:
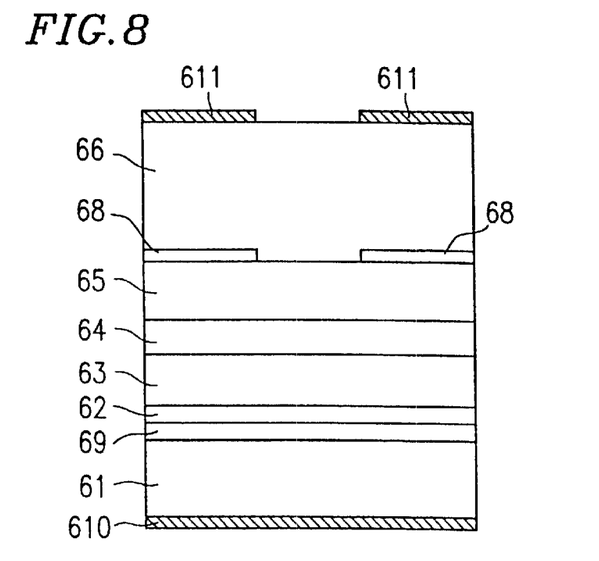
FIG. 8 is a schematic cross-sectional view illustrating a structure of a semiconductor light emitting device according to Embodiment 6 of the present invention.

FIG. 8 is a schematic cross-sectional view illustrating the structure of the light emitting diode of the present embodiment. The light emitting diode includes an n-GaAs substrate 61 whose principal plane is inclined from the (100) plane toward the [011] orientation by an angle of about 15°. The light emitting diode further includes a first buffer layer 69, a second buffer layer 62, a first cladding layer 63, an active layer 64, and the second cladding layer 65. The first buffer layer 69 has a thickness of about 0.5 μm and a composition of n-$Al_xGa_{1-x}As$ ($0 \leq x \leq 1$; in this example, x=0 and the Si concentration is about $5 \times 10^{17}$ cm$^{-3}$, for example). The second buffer layer 62 has a thickness of about 0.05 μm and a composition of n-$Al_yGa_zIn_{1-y-z}P$ ($0 \leq y \leq 1$ and $0 \leq z \leq 1$; in this example, y=0.3, z=0.0, and the Si concentration is about $5 \times 10^{17}$ cm$^{-3}$, for example). The first cladding layer 63 has a thickness of about 1.0 μm and a composition of n-$Al_sGa_tIn_{1-s-t}P$ ($0 \leq s \leq 1$ and $0 \leq t \leq 1$; in this example, s=0.5, t=0.0, and the Si concentration is about $5 \times 10^{17}$ cm$^{-3}$, for example). The active layer 64 has a thickness of about 0.5 μm and a composition of $Al_aGa_bIn_{1-a-b}P$ ($0 \leq a \leq 1$ and $0 \leq b \leq 1$; in this example, a=0.4 and b=0.5, for example). The second cladding layer 65 has a thickness of about 1.0 μm and a composition of p-$Al_cGa_dIn_{1-c-d}P$ ($0 \leq c \leq 1$ and $0 \leq d \leq 1$; in this example, c=0.5, d=0.5, and the Zn concentration is about $5 \times 10^{17}$ cm$^{-3}$, for example). A current blocking layer 68 is provided in the peripheral portion of the top surface of the second cladding layer 65. The current blocking layer 68 has a thickness of about 0.5 μm and a composition of n-GaP (herein, the Zn concentration is about $1 \times 10^{19}$ cm$^{-3}$). The current diffusing layer 66 is deposited on the current blocking layer 68 and the exposed surface of the second cladding layer 65. The current diffusing layer 66 has a thickness of about 5 μm and a composition of $In_fAl_gGa_{1-f-g}P$ ($0 < f < 1$ and $0 < g < 1$; in this example, f=0.01, g=0.01, and the Zn concentration is about $5 \times 10^{18}$ cm$^{-3}$, for example). An electrode 610 is provided in the peripheral portion of the surface of the current diffusing layer 66, and another electrode 610 is provided on the reverse side of the n-GaAs substrate 61.

In the light emitting diode of the present embodiment, the current blocking layer 68 is provided in the peripheral portion of the device, between the second cladding layer 65 and the current diffusing layer 66. As a result, the current injected from the electrode 611 is localized to the central portion through the current diffusing layer 66, thereby further improving the light extraction efficiency.

As described above in detail, according to the present invention, the effects of inclining the principal plane of the GaAs substrate from the (100) plane toward the [011] orientation are significantly pronounced by employing, for the buffer layer, a two-layer structure including the $Al_xGa_{1-x}As$ ($0 \leq x \leq 1$) first buffer layer and the $Al_yGa_zIn_{1-y-z}P$ ($0 \leq y \leq 1$ and $0 \leq z \leq 1$) second buffer layer. As a result, it is possible to obtain a semiconductor light emitting device in which the crystallinity of the light emitting section, particularly the active layer, is is significantly improved, thereby improving the emission efficiency.

By appropriately setting the composition of the second buffer layer to be different from that of the first cladding layer, it is possible to further improve the crystallinity of the light emitting section, particularly the active layer, thereby improving the emission efficiency. Alternatively, by appropriately setting the growth temperature for the second buffer layer to be different from that for the first cladding layer, or by gradually changing the growth temperature for the second buffer layer or the first cladding layer, it is possible to further improve the crystallinity of the light emitting section, particularly the active layer, thereby improving the emission efficiency. Particularly, significant effects can be expected where the Al content of the first cladding layer is larger than that of the second buffer layer, with the Al content of the second buffer layer being equal to or greater than about 0.3 and less than or equal to about 0.8.

By providing a current diffusing layer on the second cladding layer, the injected current flow can be diffused through the current diffusing layer so as to efficiently utilize the entire active layer for emitting light, thereby significantly improving the emission efficiency.

By providing a current blocking layer between the second cladding layer and the current diffusing layer, the injected current flow can be even better diffused through the current diffusing layer so as to more efficiently utilize the entire active layer for emitting light, thereby further improving the emission efficiency.

By providing the current blocking layer in the central portion of the device, it is possible to diffuse the injected current flow toward the peripheral portion of the device and to efficiently extract the generated light from the device, thereby significantly improving the emission efficiency.

Alternatively, the current blocking layer may be provided in a peripheral portion of the device. In such a case, it is possible to localize the current flow to the central portion of the device, thereby increasing the current density, and to efficiently extract the generated light from the device, thus significantly improving the emission efficiency.

By providing a light reflecting layer closer to the substrate with respect to the first cladding layer, a portion of the generated light, which would otherwise be absorbed by the substrate, can be reflected by the light reflecting layer so that it can be extracted from the device, thereby significantly improving the efficiency of use of the generated light.

The present invention can be used to provide a semiconductor laser device by providing a current blocking layer and a cap layer on the second cladding layer.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device, comprising:

a GaAs substrate whose principal plane is inclined from a (100) plane in a <011> orientation;

a first buffer layer of $Al_xGa_{1-x}As$ ($0 \leq x \leq 1$) provided on the principal plane of the GaAs substrate;

a second buffer layer of $Al_yGa_zIn_{1-y-z}P$ ($0 \leq y \leq 1$ and $0 \leq z \leq 1$) provided on the first buffer layer;

a first cladding layer of $Al_sGa_tIn_{1-s-t}P$ ($0 \leq s \leq 1$ and $0 \leq t \leq 1$) provided on and contacting the second buffer layer;

an active layer provided on the first cladding layer; and a second cladding layer provided on the active layer, wherein an Al content s of the first cladding layer is larger than an Al content y of the second buffer layer, and wherein the first cladding layer and the second buffer layer are of the same composition type.

2. A semiconductor light emitting device according to claim 1, wherein the principal plane of the GaAs substrate is inclined from the (100) plane toward the [011] orientation by an angle equal to or greater than about 2°.

3. A semiconductor light emitting device according to claim 1, wherein the Al content y of the second buffer layer is equal to or greater than about 0.3 and less than or equal to about 0.8.

4. A semiconductor light emitting device according to claim 1, wherein a growth temperature for the second buffer layer is different from that for the first cladding layer.

5. A semiconductor light emitting device according to claim 1, wherein a growth temperature for the second buffer layer is equal to that for the first cladding layer.

6. A semiconductor light emitting device according to claim 1, wherein a growth temperature for the first buffer layer is equal to that for the second buffer layer.

7. A semiconductor light emitting device according to claim 1, wherein the second buffer layer is grown while changing a growth temperature therefor in a stepwise or continuous manner.

8. A semiconductor light emitting device according to claim 1, wherein the first cladding layer is grown while changing a growth temperature therefor in a stepwise or continuous manner.

9. A semiconductor light emitting device according to claim 1, further comprising a current diffusing layer on the second cladding layer.

10. A semiconductor light emitting device according to claim 9, further comprising a current blocking layer between the second cladding layer and the current diffusing layer.

11. A semiconductor light emitting device according to claim 10, wherein the current blocking layer is provided in a central portion of the semiconductor light emitting device.

12. A semiconductor light emitting device according to claim 10, wherein the current blocking layer is provided in a peripheral portion of the semiconductor light emitting device.

13. A semiconductor light emitting device according to claim 1, wherein the active layer is a quantum well active layer obtained by depositing a number of quantum well layers and a number of barrier layers in an alternating pattern.

14. A semiconductor light emitting device according to claim 1, further comprising a current blocking layer provided on the second cladding layer and a cap layer provided on the current blocking layer.

15. A semiconductor light emitting device according to claim 1, further comprising a light reflecting layer provided closer to the GaAs substrate with respect to the first cladding layer.

16. A semiconductor light emitting device, comprising:

a GaAs substrate whose principal plane is inclined from a (100) plane in a <011> orientation;

a first buffer layer of $Al_xGa_{1-x}As$ ($0 \leq x \leq 1$) provided on the principal plane of the GaAs substrate and contacting the substrate;

a second buffer layer of $Al_yGa_zIn_{1-y-z}P$ ($0 \leq y \leq 1$ and $0 \leq z \leq 1$) provided on the first buffer layer so as to contact the first buffer layer;

a first cladding layer of $Al_sGa_tIn_{1-s-t}P$ ($0 \leq s \leq 1$ and $0 \leq t \leq 1$) provided on the second buffer layer so as to contact the second buffer layer;

an active layer provided on the first cladding layer; and a second cladding layer provided on the active layer, wherein each of the first cladding layer and the second buffer layer include Al, and an Al content s of the first cladding layer is larger than an Al content y of the second buffer layer.

17. A semiconductor light emitting device, comprising:

a substrate comprising GaAs whose principal plane is inclined from a (100) plane in a <011> orientation;

a first buffer layer provided on the substrate;

a second buffer layer comprising $Al_yGa_zIn_{1-y-z}P$ ($0 \leqq y \leqq 1$ and $0 \leqq z \leqq 1$) provided on the first buffer layer;

a first cladding layer comprising $Al_sGa_tIn_{1-s-t}P$ ($0 \leqq s \leqq 1$ and $0 \leqq t \leqq 1$) provided on the second buffer layer;

an active layer provided on the first cladding layer; and a second cladding layer provided over the active layer, wherein each of the first cladding layer and the second buffer layer include Al, and an Al content of the first cladding layer is larger than an Al content of the second buffer layer, and wherein the second buffer layer contacts each of the first buffer layer and the first cladding layer.

\* \* \* \* \*